United States Patent
Tanaka

(10) Patent No.: US 8,186,046 B2
(45) Date of Patent: May 29, 2012

(54) METHOD FOR MANUFACTURING A MULTILAYER PRINTED WIRING BOARD FOR PROVIDING AN ELECTRONIC COMPONENT THEREIN

(75) Inventor: Hironori Tanaka, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 698 days.

(21) Appl. No.: 12/325,498

(22) Filed: Dec. 1, 2008

(65) Prior Publication Data

US 2009/0242252 A1 Oct. 1, 2009

Related U.S. Application Data

(60) Provisional application No. 61/040,015, filed on Mar. 27, 2008.

(51) Int. Cl.
*H05K 3/30* (2006.01)
(52) U.S. Cl. ............. 29/832; 29/830; 29/834; 29/842; 29/846; 29/852
(58) Field of Classification Search .......... 29/830, 29/832, 834, 841, 846, 852
See application file for complete search history.

(56) References Cited

U.S. PATENT DOCUMENTS

| 2008/0202801 A1* | 8/2008 | Tuominen et al. ............ 174/260 |
| 2009/0244865 A1* | 10/2009 | Tanaka .......................... 361/764 |

FOREIGN PATENT DOCUMENTS

| JP | 2001-332863 | 11/2001 |
| JP | 2002-246757 | 8/2002 |

* cited by examiner

*Primary Examiner* — Derris Banks
*Assistant Examiner* — Azm Parvez
(74) *Attorney, Agent, or Firm* — Oblon, Spivak, McClelland, Maier & Neustadt, L.L.P.

(57) ABSTRACT

A multilayer printed wiring board and method for manufacturing a multilayer printed wiring board. One method include a method for manufacturing a multilayer printed wiring board having an electronic component housed therein. The method includes forming a conduction circuit on a core substrate and forming an alignment mark on the core substrate separate from the conduction circuit. Also included is forming a concavity in the core substrate, the concavity being formed in an area of the core substrate not including the conductor circuit and alignment mark, and inserting the electronic component into the concavity in the core substrate by using the alignment mark on the core substrate to align the electronic component with the concavity.

16 Claims, 15 Drawing Sheets

FIG. 1
(A)
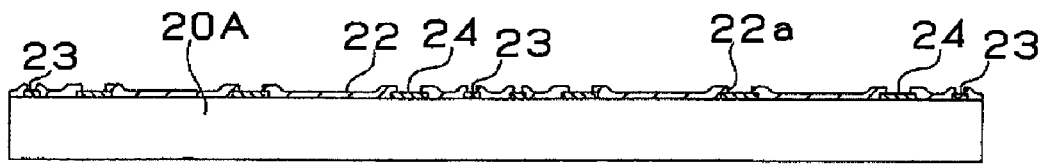
(B)
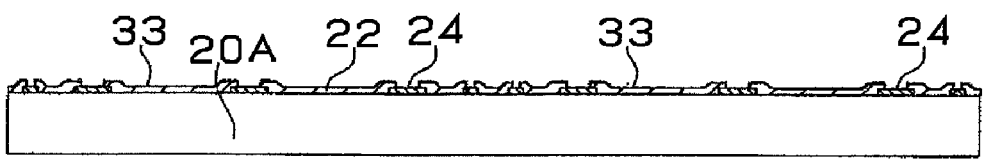
(C)
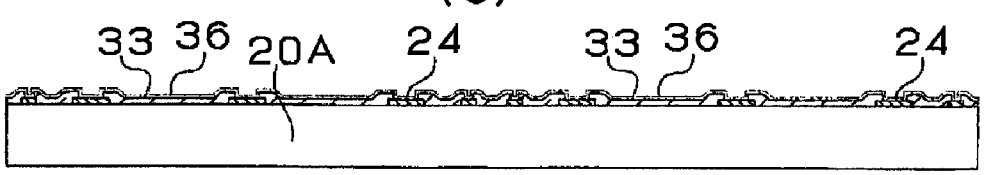
(D)
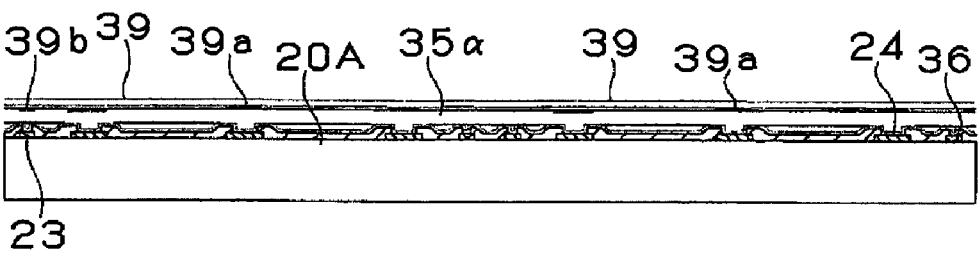

FIG. 2
(A)
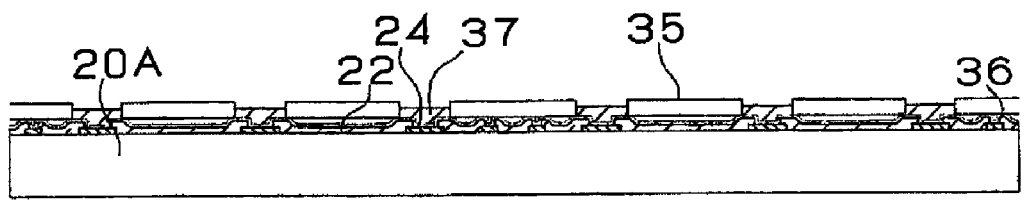
(B)
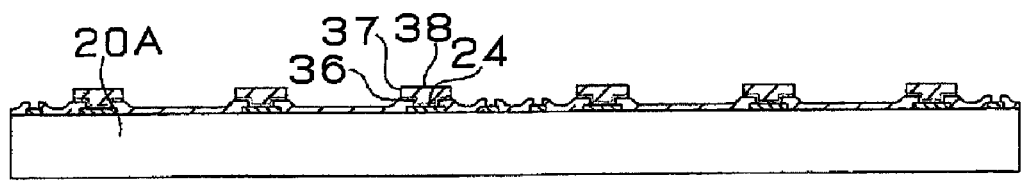
(C)
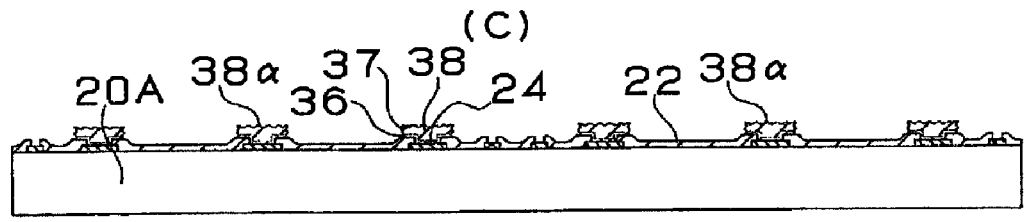
(D)
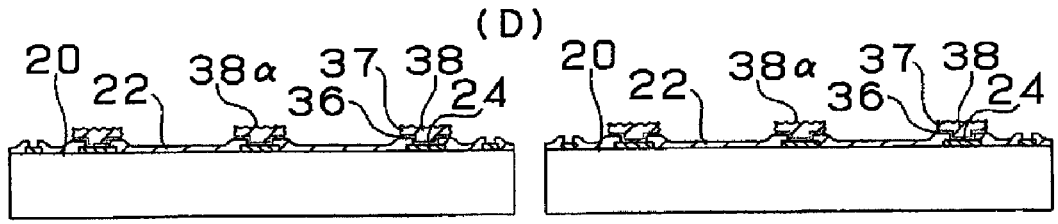

FIG. 3
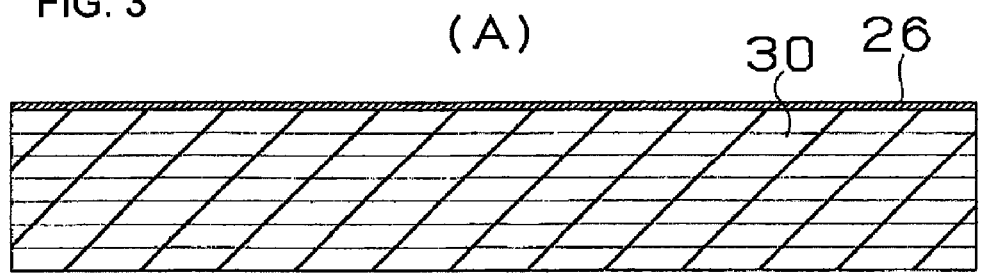
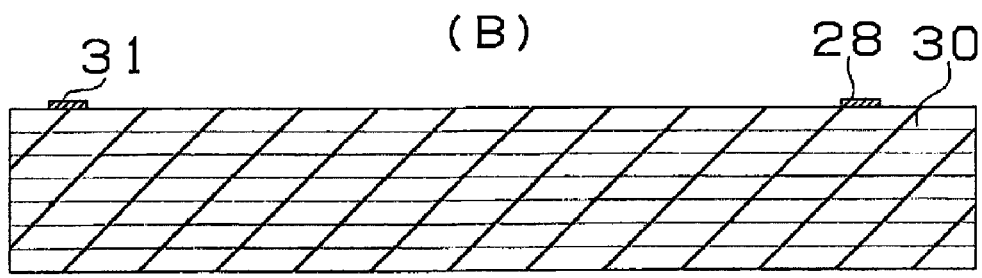
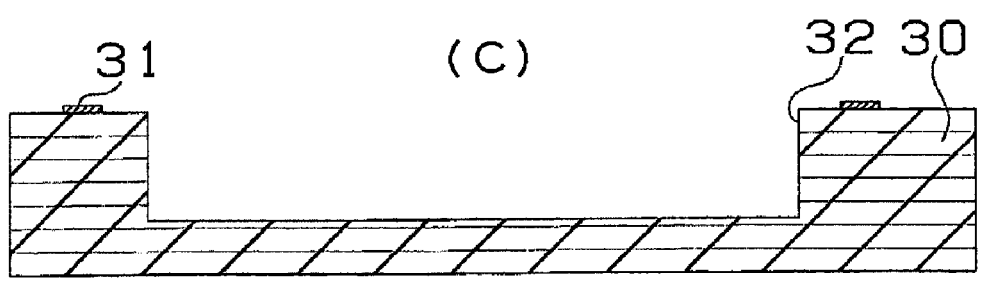
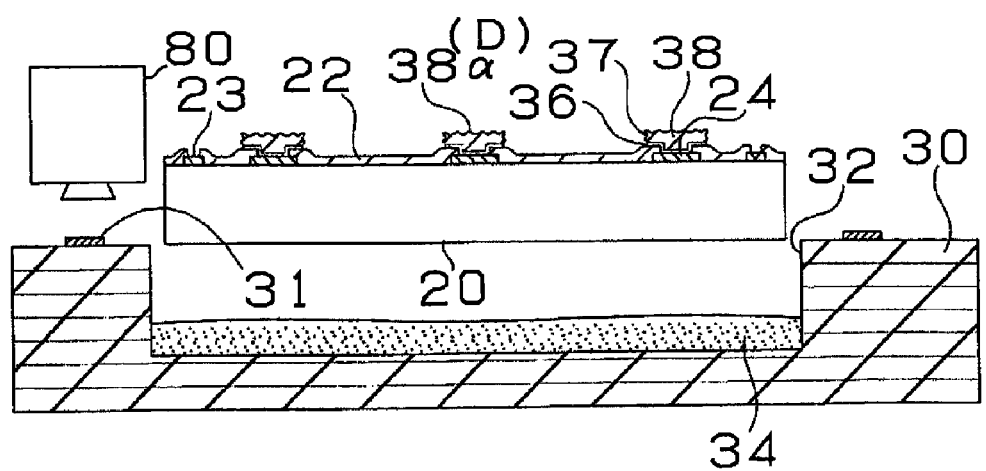

FIG. 11
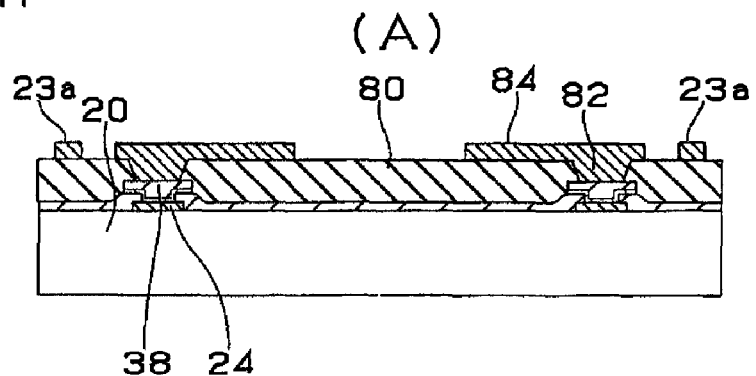
(A)
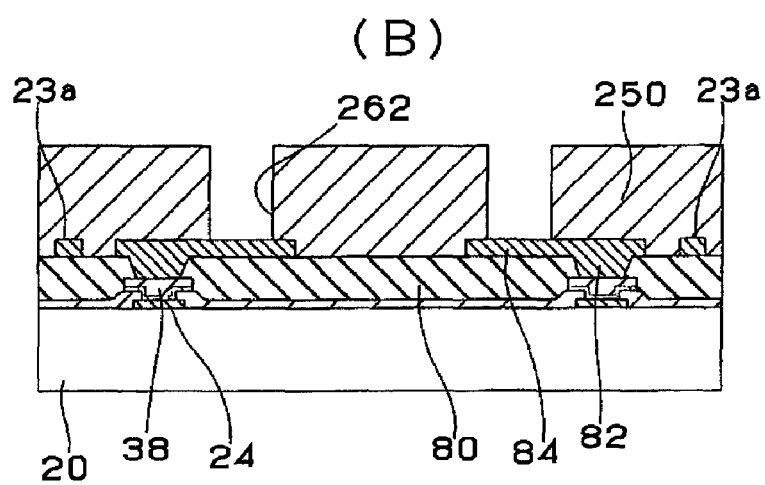
(B)
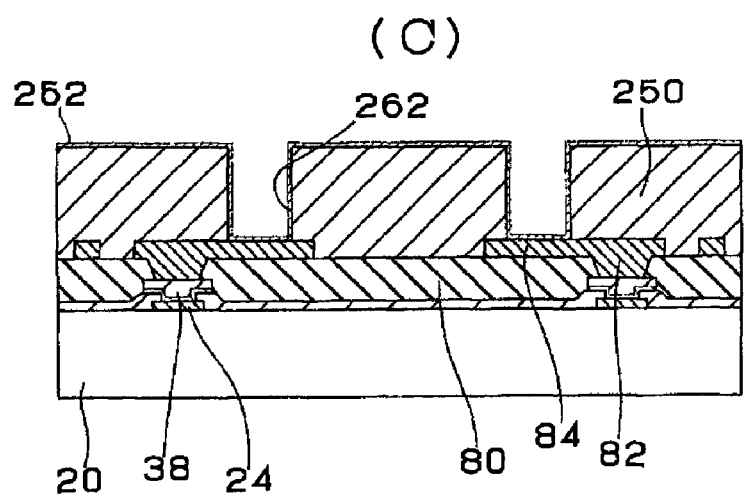
(C)

METHOD FOR MANUFACTURING A MULTILAYER PRINTED WIRING BOARD FOR PROVIDING AN ELECTRONIC COMPONENT THEREIN

CROSS-REFERENCE TO RELATED APPLICATIONS

The present application claims the benefit of priority to U.S. Application No. 61/040,015, filed Mar. 27, 2008. The entire content of that application is incorporated herein by reference.

BACKGROUND OF THE INVENTION

1. Technical Field

This invention relates to manufacturing multilayer printed wiring boards. The invention is more particularly related to a method for manufacturing multilayer printed wiring boards equipped with electronic elements including IC chips or other active elements, as well as chip capacitors or other passive elements.

2. Background Art

Integrated circuit (IC) chips are electrically connected with printed wiring boards by mounting methods including wire bonding, tape automated bonding (TAB), and flip-chip mounting. In addition, chip capacitors are often surface-mounted on substrates. IC chip mounting methods provide electrical connections via connection lead components (wires, leads, bumps) between the IC chip and the printed wiring board. These various lead components are prone to breakage and corrosion, which can cause interruption or malfunction of the electrical connection with the IC chip. Also, surface-mounting of chip capacitors increases the length of the wiring to the IC chip, which may cause undesirable electrical characteristics.

Accordingly, methods for manufacturing printed wiring boards containing an IC chip mounted on a package substrate by housing the IC chip in a concavity formed on the package substrate (e.g., core substrate, multi-layering inter-layer resin insulating layer and conduction circuit on the core substrate) has been disclosed in JP 2001-332863 and JP 2002-246757. The content of each of these publications is incorporated herein by reference. The arrangement of these publications is intended to improve connectivity between the printed wiring board and the IC chip.

BRIEF SUMMARY OF EMBODIMENTS OF THE INVENTION

One aspect of the invention includes a method for manufacturing a multilayer printed wiring board having an electronic component housed therein. The method includes forming a conduction circuit on a core substrate and forming an alignment mark on the core substrate separate from the conduction circuit. Also included is forming a concavity in the core substrate, the concavity being formed in an area of the core substrate not including the conductor circuit and alignment mark, and inserting the electronic component into the concavity in the core substrate by using the alignment mark on the core substrate to align the electronic component with the concavity.

Another aspect of the invention includes a method for preparing an electronic component to be housed in a multilayer printed wiring board. The method includes forming a passivation layer over a connection terminal of the electronic component and forming an opening in the passivation layer to expose the connection terminal. Further an intermediate conductor is formed in contact with the connection terminal, wherein the electronic component can be inserted into a concavity of a core substrate such that residual resin will not remain on the connection terminal from a resin subsequently formed on the core substrate.

A further aspect of the invention includes a method for manufacturing a multilayer printed wiring board having an electronic component housed therein. The method includes forming a passivation layer over a connection terminal of the electronic component, forming an opening in the passivation layer to expose the connection terminal and forming an intermediate conductor in contact with the connection terminal. A conduction circuit is formed on a core substrate and an alignment mark is formed on the core substrate separate from the conduction circuit. Also included is forming a concavity in the core substrate, the concavity being formed in an area of the core substrate not including the conductor circuit and alignment mark, and inserting the electronic component having the intermediate conductor thereon into the concavity in the core substrate by using the alignment mark on the core substrate to align the electronic component with the concavity.

Still another aspect of the invention includes a core substrate having a concavity formed therein, an electronic component having a connection terminal and housed within the concavity in the core substrate and at least one interlayer insulating layer provided on the core substrate and on the electronic component such that the electronic component is embedded within the multilayer printed wiring board. A conductor is provided on a surface of the interlayer insulating layer and at least one via structure electrically connecting the conductor of the interlayer insulating layer with the connector terminal of the electronic component. At least one alignment mark is embedded within the multilayer printed wiring board, the at least one alignment mark not being electrically connected to the connection terminal and not being electrically connected to the conductor. The alignment mark provides a mechanism for aligning the electronic component with the concavity during assembly of the multilayer printed wiring board.

BRIEF DESCRIPTION OF VIEWS OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 1(A), (B), (C), and (D) are diagrams of manufacturing processes that can be used for manufacturing a first embodiment of a multilayer printed wiring board of invention.

FIGS. 2(A), (B), (C), and (D) are diagrams of manufacturing processes that can be used for the first embodiment of the multilayer printed wiring board of invention.

FIGS. 3(A), (B), (C), and (D) are diagrams of manufacturing processes that can be used for the first embodiment of the multilayer printed wiring board of invention.

FIGS. 11(A), (B), and (C) are diagrams of manufacturing processes that can be used for a third embodiment of the multilayer printed wiring board of the invention.

DETAILED DESCRIPTION OF PREFERRED EMBODIMENTS OF THE INVENTION

Figure 4:
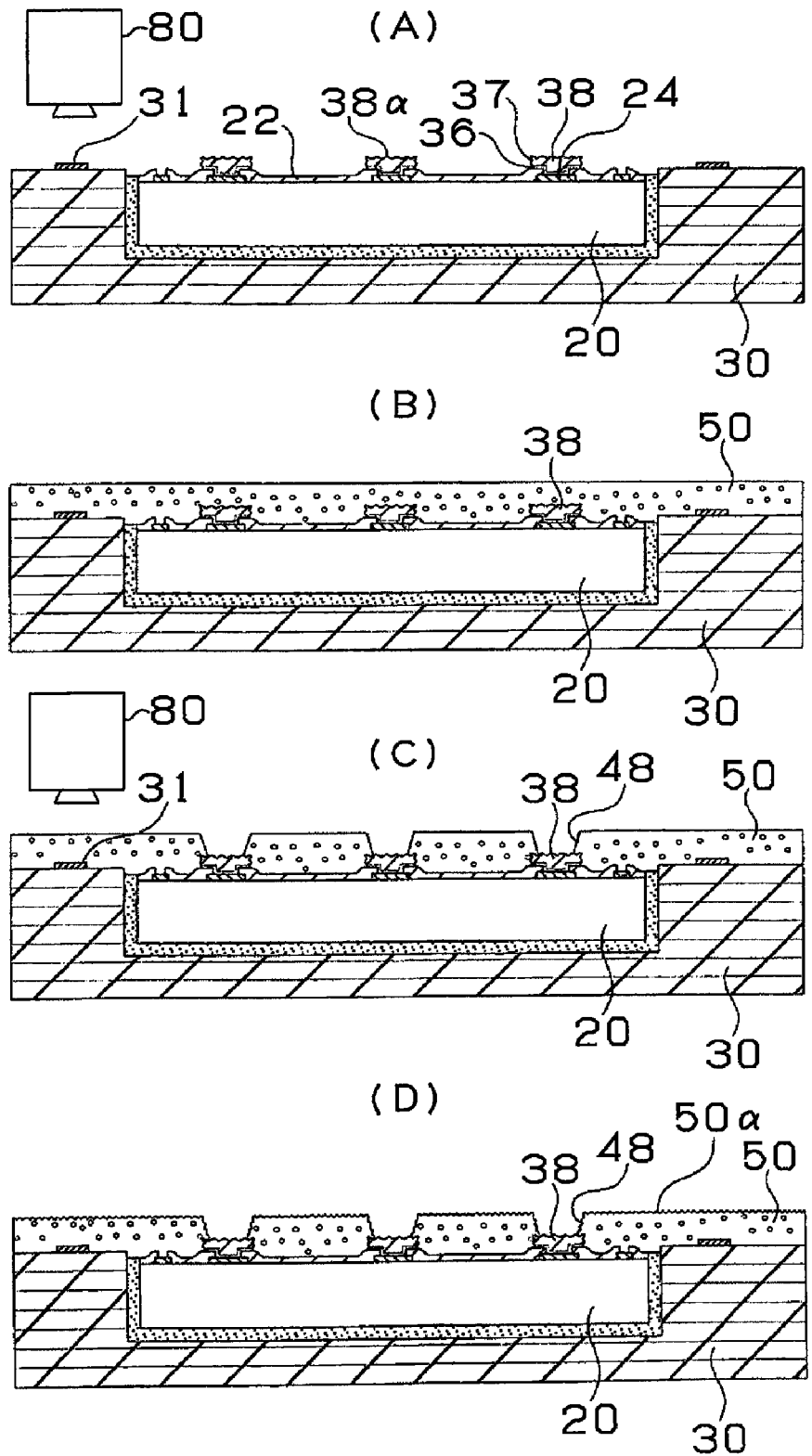
FIGS. 4(A), (B), (C), and (D) are diagrams of manufacturing processes that can be used for the first embodiment of the multilayer printed wiring board of invention.
Figure 5:
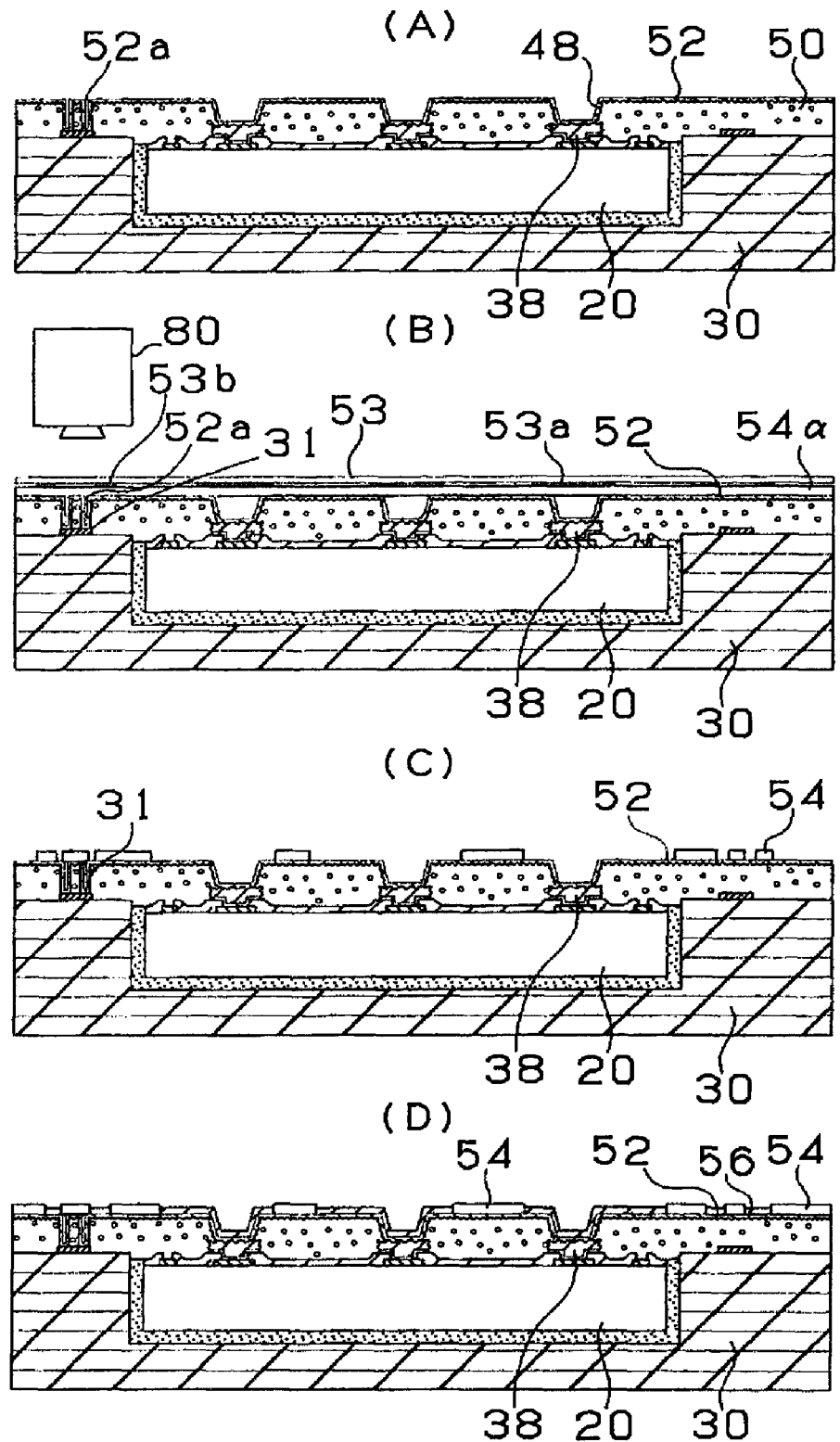
FIGS. 5(A), (B), (C), and (D) are diagrams of manufacturing processes that can be used for the first embodiment of the multilayer printed wiring board of invention.
Figure 6:
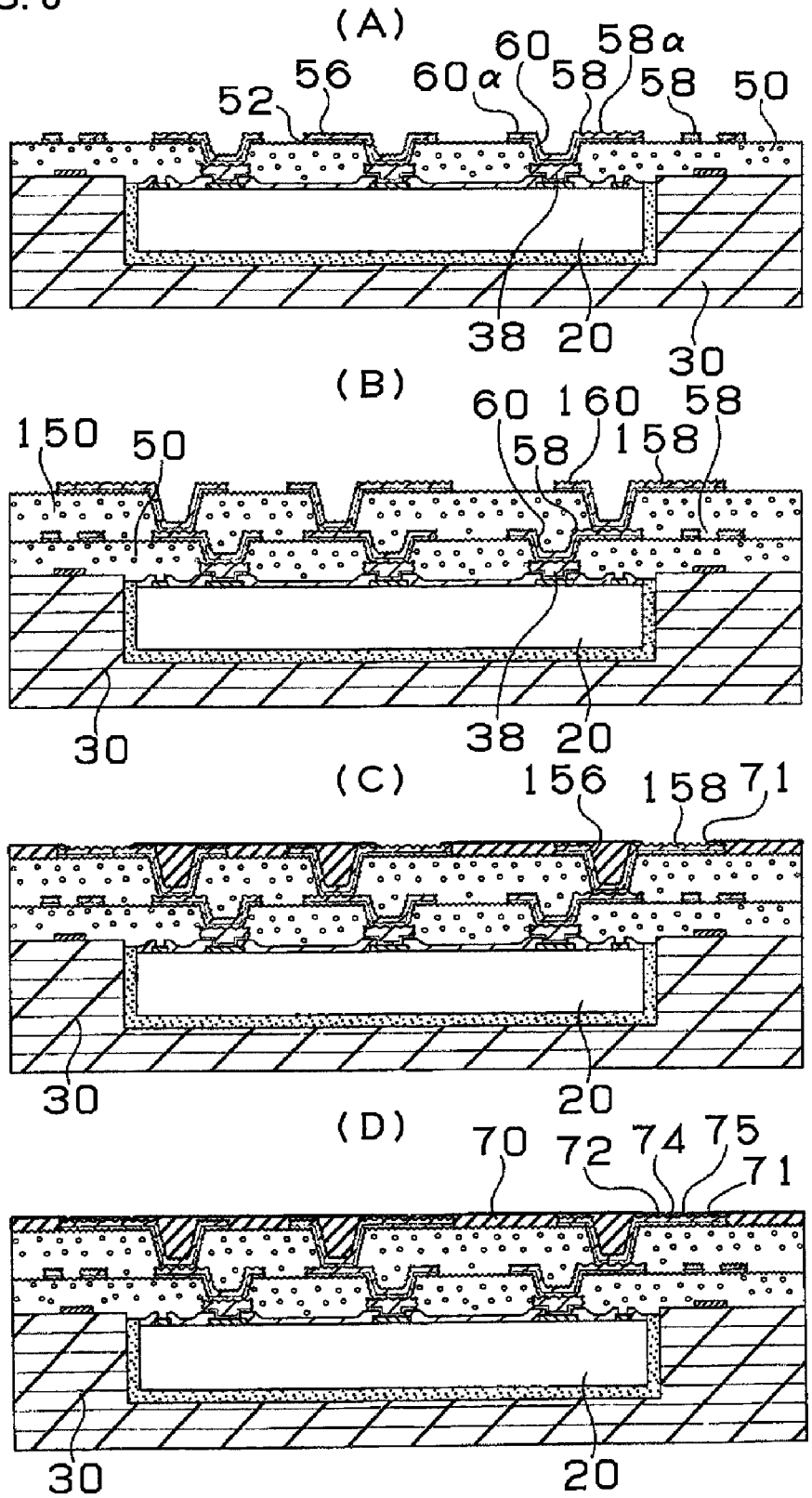
FIGS. 6(A), (B), (C), and (D) are diagrams of manufacturing processes that can be used for the first embodiment of the multilayer printed wiring board of invention.

As noted above, the arrangement of an electric component provided within a cavity of a substrate is intended to improve connectivity between the printed wiring board and the IC chip, for example. However, the present inventors have recognized that conventional methods of providing this arrangement are problematic. For example, with the method for manufacturing in JP 2001-332863, a cavity that serves as a alignment mark is created on the substrate using a laser. However, a residue of a resin is apt to remain within the cavity, and the evenness or unevenness of the residue may make it impossible to accurately align the IC chip and substrate with the alignment mark using image recognition. As a result, misalignment can occur between the IC chip pad and the via hole, thus making it impossible to form an electrical connection.

One object of embodiments of the invention is to provide a method for manufacturing multilayer printed wiring boards that enables the appropriate formation of connections with terminals of mounted electrical components.

An embodiment of the invention includes a method for manufacturing multilayer printed wiring boards wherein an inter-layer insulating layer and a conductor layer are repeatedly formed on a substrate, a via hole is formed in the inter-layer insulating layer, and electrical connections are performed through the via hole. The method includes at least one of the following processes (a) through (e):

(a) a process of simultaneously forming alignment marks with the conduction circuit on the substrate;

(b) a process of forming an concavity on the substrate;

(c) a process of housing an electronic component in the concavity based on the alignment marks on the substrate;

(d) a process of forming an interlayer insulating layer on the substrate and the electronic component; or (e) a process of forming via hole openings leading to a terminal of the electronic component based on the alignment marks.

In one aspect of the invention, on the substrate that is to house an electronic component, a conductor circuit and alignment marks are simultaneously formed, a concavity is formed on the substrate, and the electronic component is housed in the concavity based on the alignment marks. In addition, an inter-layer insulating layer is formed above the substrate and the electronic component, and via hole apertures are formed in the insulating layer leading to a terminal of the electronic component based on the alignment marks. Accordingly, it is possible to form via holes in the inter-layer insulating layer on the substrate so that image recognition is easy to use with the positioning marks and electronic component alignment can be performed accurately.

It is also possible to perform fabrication based on the alignment marks. In this instance, the term "fabrication" refers to the entirety of IC chip that constitutes the electronic component and the items formed on the substrate. For example, the term includes the intermediary layer above the IC chip pad, recognition characters (alphabetic, numeric, etc.) and positioning marks.

Also, in this instance the term "forming" refers to the entirety of the forming on top of the inter-layer insulating layer applied to the core substrate (not including glass cloth and other reinforcing materials). For example, the term includes via holes, wiring, recognition characters (alphabetic, numeric, etc.), and alignment marks.

Resin substrates to hold IC chips or other electronic components used according to embodiments of the invention may include epoxy resin, BT resin, and phenol resin, along with reinforcing material such as fiberglass and alamid fiber and prepreg impregnated with core material. However, any material generally used with printed wiring boards can be used. In addition to these, it is also possible to use two-sided copper-clad multilayer sheets, single-sided sheets, resin sheets with no metal film, and resin film. However, if temperatures of 350 degrees or higher are applied, resin will melt and carbonize.

IC chips that can be used according to embodiments of the invention include bare chips, chips with an intermediary layer formed on the die pad in the connection between the die pad and the via hole, chips with a redistribution layer formed on the die pad, and chips with a polar electrode connected to the redistribution layer. In addition, two or more redistribution layers may be used.

The following section describes embodiments of the invention in reference to drawings. First, a discussion will be made of the configuration of a multilayer printed wiring board in a first embodiment of the invention in reference to FIG. 7, which shows a sectional view of multilayer printed wiring board.

Figure 7:
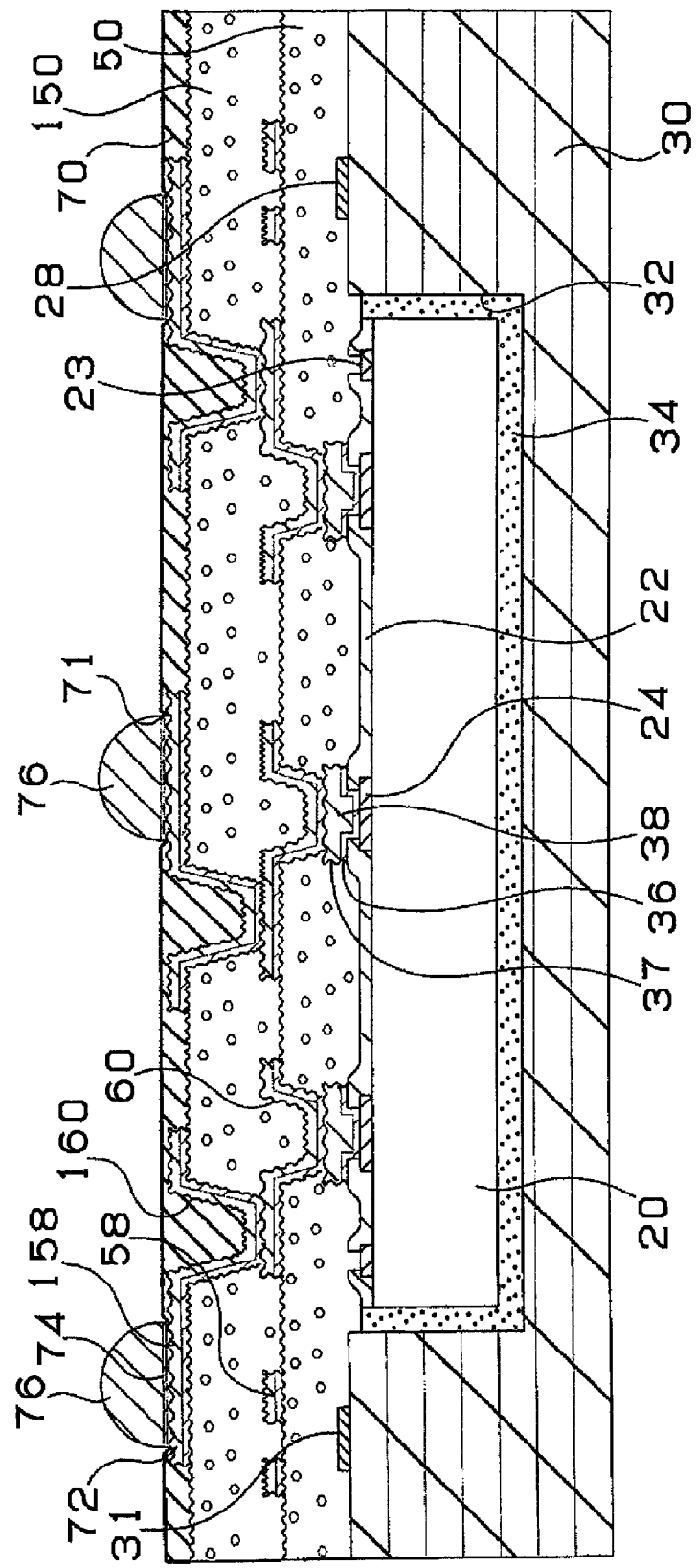
FIG. 7 is a sectional view of the first embodiment of the multilayer printed wiring board of the invention.

As shown in FIG. 7, multilayer printed wiring board 10 includes core substrate 30 housing IC chip 20, inter-layer resin insulating layer 50, and inter-layer resin insulating layer 150. Formed in inter-layer resin insulating layer 50 is via hole 60 and conductor circuit 58, and formed in inter-layer resin insulating layer 150 is via hole 160 and conductor circuit 158.

IC chip 20 is covered with passivation film 22, and within openings of this passivation film 22 is disposed a die pad (pad) 24 (e.g. an I/O terminal) and an alignment mark 23. Upon pad 24 is formed an intermediary layer 38 consisting mainly of copper.

A solder resist layer 70 is applied onto the inter-layer resin insulating layer 150. A solder bump 76, the purpose of which is to connect with a daughterboard, motherboard or other external substrate (not shown in FIG. 7), is disposed on the conductor circuit 158 below the opening 71 of the solder resist layer 70.

With the multilayer printed wiring board of the embodiment shown in FIG. 7, the IC chip 20 is installed onto the core substrate 30 in advance, and an intermediary layer 38 is applied to the pad 24 of the IC chip 20 (possibly also in advance). As a result, it is possible to form an electrical connection between the IC chip 20 and the multilayer printed wiring board (package substrate) without using lead components and sealing resin.

Also, by disposing a copper intermediary layer 38 onto the die pad 24, it is possible to prevent the presence of resin residue on the pad 24. In addition, the residue can be prevented from leaching into acid, oxidants and etching fluids used in downstream processes. Moreover, melting or discoloration of the pad 24 may not occur after the various annealing processes. This improves the connectivity and reliability between the IC chip pad and the via hole. Furthermore, by disposing the intermediary layer 38 having a radius of at least 60 µm over the pad 24 having a diameter of 40 µm, it is possible to securely connect the 60 µm via hole.

In addition, in the manufacturing process to be described hereafter, the IC chip 20 is positioned in reference to the alignment marks 31 formed on the core substrate 30, and the connection via holes 60 to the pad 24 on the IC chip 20 are formed by alignment with these alignment marks. As a result, it is possible to accurately position the via holes 60 on the pad 24 of the IC chip 20, and it is possible to securely connect the pad 24 with the via holes 60.

The following section describes, in reference to FIG. 1 through FIG. 6, a method for manufacturing the multilayer printed wiring board described in reference to FIG. 7. First, the formation process for the intermediary layer 38 on the IC chip pad will be described in reference to FIG. 1 and FIG. 2.

Pad 24, alignment marks 23 and wiring (not shown) are formed on a silicon wafer 20A as shown in FIG. 1(A). A die pad 24, the alignment marks 23, and the wiring (not shown) are covered with a passivation layer 22, and an opening 22a in the passivation layer is disposed on the die pad 24 and the alignment marks 23.

As shown in FIG. 1(B), deposition, sputtering or other physical deposition is performed to form conductive metallic film (thin film layer) 33 over the entire surface of the silicon wafer 20A. One or more of the metals tin, chromium, titanium, nickel, zinc, cobalt, gold or copper may be used to form this layer. Forming with nickel, chromium or titanium is especially preferable because these metals offer superior metallic adhesion, with no infiltration of moisture from the interface. In some cases it may be advantageous to form two or more layers of different metals. As for thickness, it is preferable to form the thin film layer 33 in the thickness range of 0.001~2.0 µm, and the range of 0.01~1.0 µm is especially preferable.

A plating film 36 may be formed on the metallic film 33 using non-electrolytic plating as seen in FIG. 1(C). The types of plating formed may include copper, nickel, gold or silver. Using copper is advantageous in terms of electrical properties and economy, and further because conductor layers formed in downstream processes can be mainly copper. It is preferable that the thickness of the plating film 36 be in the range of 0.01-5.0 µm. If the thickness is under 0.01 µm, it may become impossible to form a plating film over the entire surface, while if the thickness is greater than 5.0 µm, it may become difficult to remove the plating during etching, and/or the alignment marks can be covered up making recognition difficult. A preferable thickness range is 0.1~3.0 µm. Further, preferable combinations of first and second thin film layers are chromium-copper, chromium-nickel, titanium-copper, and titanium-nickel. These combinations are superior to others in terms of bonding strength and electrical transmissivity.

Thereafter, resist 35α is applied to the structure, and mask 39 having a pattern 39a and an alignment mark 39b corresponding to pad 24 and mark 23 respectively, is mounted as shown in FIG. 1(D). The alignment of the mask 39 is performed by shining a light from above and photographing reflected light from the alignment mark 23 using a camera so that the alignment mark 23 on the silicon wafer 20A matches with the alignment mark 39b. In this embodiment, since a copper plating film 36 is formed on the alignment mark 23, reflective light passes easily through the resist 35α and it is easy to align the substrate (or wafer) with the mask.

After the resist 35α is exposed and developed, a plating resist 35 is formed so as to dispose an opening in the upper portion of the pad 24 on the silicon wafer 20A, and an electrolytic plating film 37 is disposed by electrolytic plating as seen in FIG. 2(A). After the plating resist 35 is removed, the non-electrolytic plating film 36 and the metallic film 33 are removed, thereby forming the intermediary layer 38 on top of the pad 24 on the IC chip as shown in FIG. 2(B). Here, the intermediary layer is fabricated using a plating resist, but it is also possible to form the intermediary layer on the IC chip pad by forming an etching resist after an electrolytic plating film is formed on the non-electrolytic plating film 36, exposing and developing the resist, and exposing the metal in the area other than the intermediary layer. The electrolytic plating film can be formed from nickel, copper, gold, silver, zinc or iron, for example. The preferable thickness of the electrolytic plating film is in the range of 1-20 µm. If the layer is thicker than this, undercutting can occur during etching; also, gaps can occur in the interface between the formed intermediary layer and the via hole.

Next, an etching fluid is sprayed onto the silicon wafer 20A, and the surface of the intermediary layer 38 is etched to form a roughened surface 38α (see FIG. 2(C)). It is also possible to form the roughened surface using a non-electrolytic plating and an oxidation-reduction process.

Finally, the silicon wafer 20A upon which the intermediary layer 38 has been formed is divided into pieces by dicing, etc., to form IC chips 20 as seen in FIG. 2(D). After this, operation checks and electrical inspections may be performed on the divided IC chips 20. In the embodiment of FIGS. 1 and 2, the IC chips 20 have formed on them the intermediary layer 38, which is larger than pad 24. This makes it easier to insert probe pins, thus increasing the precision of inspections.

Next, the process of housing the IC chip 20 onto the core substrate will be described with respect to FIGS. 3 through 6.

(1) First, an insulating resin substrate (core substrate) 30 consisting of a one-sided copper-clad multilayer sheet covered with prepreg (for which the glass cloth or other core material is impregnated with epoxy or other resin) and layered with a copper foil 26 is used as the starting material (see FIG. 3(A)). An etching resist with a specified pattern is formed on the copper foil 26. The copper foil is removed from the area where the etching resist was not formed, and then the etching resist is peeled off, thus forming the alignment marks 31 and the conductor circuit 28 (see FIG. 3(B)). In the embodiment of FIG. 3, the alignment marks 31 are formed simultaneously with the conductor circuit 28, but this is not necessary for the present invention. Next, a concavity 32 for housing the IC chip is formed on one side of the core substrate 30 by concavity fabrication (see FIG. 3(C)). In the case of concavity fabrication, it is preferable to form a metal film upon which to mount the IC chip 20 on a bottom of the concavity. This makes the depth of the concavity more uniform and makes it easier to assure connectivity and reliability with the via hole to connect with the IC chip. Here, concavity fabrication in the core substrate is used to create the concavity, but it is possible to form a core substrate that comprises a housing by overlaying an insulating resin substrate having an opening with a resin insulating substrate not having an opening. However, insulating resin substrates melt and carbonize under temperatures of 350 degrees or higher.

(2) Thereafter, a printing device is used to apply an adhesive material 34 to the concavity 32. At this time, bonding may be performed in addition to application of adhesive. Next, the alignment marks 23 on the IC chip 20 are used to align the IC chip 20 on a pick up machine (not shown) and the alignment marks 31 on the core substrate 30 are used to align the IC chip 20 with the cavity 32. The IC chip 20 is then mounted onto the adhesive material 34 (see FIG. 3(D)). In addition, the upper surface of the IC chip 20 is pressed to insert the chip into the concavity 32 as shown in FIG. 4(A).

(3) A thermally hardened cycloolefin resin sheet with a thickness of 50 μm is heated to a temperature of 50~150 degrees C. and vacuum compression bonding laminated at a pressure of 5 kg/cm$^2$, forming the inter-layer resin insulating layer 50, which is composed of cycloolefin resin (see FIG. 4(B)). The vacuum level during vacuum compression bonding is 10 mm Hg, for example and the insulating layer 50 is preferably transparent.

(4) Next, alignment is performed by photographing the alignment mark 31, using the camera 80, through the inter-layer resin insulating layer 50 as shown in FIG. 4(C). A via hole opening 48 with a diameter of 80 μm is disposed onto the inter-layer resin insulating layer 50 using, for example, a 10.4 μm CO$_2$ gas laser, with a beam radius of 5 mm, a pulse width of 5.0 micro-seconds, and a mask aperture radius of 0.5 mm, under 1-shot conditions (see FIG. 4(C)). Resin residue within the opening 48 may be removed using chromic acid, etc. In this embodiment, by disposing the copper intermediary layer onto the die pad 24, it is possible to prevent resin residue from remaining on the pad 24, thereby enhancing the connectivity and reliability between the pad 24 and the via hole 60, which will be discussed hereafter. Furthermore, by disposing an intermediary layer 38 having a larger radius of (at least 60 μm) onto a smaller radius (40 μm) pad 24, it is possible to securely connect the 60 μm via hole opening 48. Here, chromic acid is used to remove resin residue, but it is also possible to use oxygen plasma to perform a desmear process.

(5) Next, a roughened surface 50α is disposed on the inter-layer resin insulating layer 50 by immersion in an oxidizing agent such as chromic acid or permanganate (see FIG. 4(D)). Forming the roughened surface 50α in the range of 0.1~5 μm is preferable. As an example, a roughened surface 50α is disposed by immersion for 5-25 minutes at a temperature of 60 degrees C. in a 50 g/l solution of sodium permanganate. It is also possible to form the roughened surface 50α on the inter-layer resin insulating layer 50 by performing plasma processing using an SV-4540 apparatus made by Japan Vacuum Technology Corp., Ltd. When doing so, argon gas is used as an inert gas, and the plasma processing is performed, for example, for 2 minutes with electric power of 200 W, gas pressure of 0.6 Pa, and at a temperature of 70 degrees C.

(6) A metallic film 52 is disposed on the inter-layer resin insulating layer 50 upon which is formed the roughened surface 50α (see FIG. 5(A)). The metallic film 52 is formed by non-electrolytic plating. The metallic film 52, which is a plating film in the thickness range of 0.1~5 μm, can be disposed by applying first a catalyst such as palladium to the outer surface of the inter-layer resin insulating layer 50, followed by immersion for 5~60 minutes in a non-electrolytic plating fluid.

As an example, the non-electrolytic plating aqueous solution includes:

| | |
|---|---|
| NiSO$^4$ | 0.003 mol/l |
| Tartaric acid | 0.200 mol/l |
| Cupric sulfate | 0.030 mol/l |
| HCHO | 0.050 mol/l |
| NaOH | 0.100 mol/l |
| α,α'-bipyridyl | 100 mg/l |
| Polyethylene glycol (PEG | 0.10 g/l |

The assembly is immersed for 40 minutes at a liquid temperature of 34 degrees C.

It is also possible to form a Ni/Cu metallic film 52 on the outer surface of the inter-layer resin insulating layer 50 by using the plasma processing described above to provide argon gas. Sputtering targeting Ni and Cu is performed for 5 minutes with a voltage of 0.6 Pa, at a temperature of 80 degrees C., and an electric power of 200 W. At this time, the thickness of the Ni/Cu metallic film 52 formed is 0.2 μm. After metallic film 52 is formed, an aperture 52a (ring shaped aperture in FIG. 5) is formed through the film 52 and interlayer resin insulating layer 50 to reveal at least a portion of the alignment mark 31 on the substrate. Alignment mark 52a is shown only in FIG. 5, but omitted from other figures herein.

(7) After completion of the above process, a commercially-available photo-sensitive dry film 54α is provided on the substrate 30, and a photo mask film 53, upon which are inscribed a pattern 53a matching the pad, and an alignment mark 53b (for example, ring shaped). The alignment of this mask 53 is performed by shining light from above so that the light falls upon the ring-shaped alignment mark 53b and upon the portion of the alignment mark 31 exposed through the aperture 52a. Reflected light from the exposed portion of the alignment mark 31 is detected with the camera 80 so that the alignment mark 31 is aligned with the mark 53b. Where the aperture 52a is a ring shape having a smaller diameter than the ring shaped alignment mark, the camera image will appear as concentric circles if perfect alignment is achieved. As described above, it is also possible to form a copper plating film on the alignment mark 31 in order to increase the reflection rate of the outer surface.

(8) Thereafter, after exposing at 100 mJ/cm$^2$, development processing is performed using 0.8% sodium carbonate, thereby disposing a coating resist 54 with a thickness of 15 μm (see FIG. 5(C)).

(9) In the present embodiment, an electrolytic plating is then applied under the conditions listed below, forming an electrolytic plating film 56 with a thickness of 15 μm (see FIG. 5(D)). An additive in the electrolytic plating aqueous solution is Caparacid HL made by Atotek Japan Corp., Ltd.

The electrolytic plating aqueous solution includes:

| | |
|---|---|
| Sulfuric acid | 2.24 mol/l |
| Cupric sulfate | 0.26 mol/l |
| Additive (Caparacid HL made by Atotek Japan) | 19.5 ml/l |

Electrolytic plating conditions include:

| | |
|---|---|
| Current density | 1 A/dm2 |
| Time | 65 minutes |
| Temperature | 22 +/− 2 deg. C. |

(10) After peeling off the plating resist 54 using 5% NaOH, the Ni—Cu alloy layer 52 under that plating resist is dissolved away by etching using sulfuric acid and a mixture of sulfuric acid and hydrogen peroxide. A 16 μm thick conductor circuit 58 consisting of the Ni—Cu alloy layer 52 and the electrolytic plating film 56, and a via hole 60 are formed. Roughened surfaces 58α and 60α are formed using an etching fluid containing a second copper complex and organic acids (see FIG. 6(A)).

(11) Next, by repeating the processes in (3)~(10) above, an inter-layer resin insulating layer 150 and a conductor circuit 158 (including a via hole 160) are formed on a further upper layer as seen in FIG. 6(B).

(12) Next, a 46.67 by weight portion of photosensitive oligomer (molecular volume 4000) with an acrylated epoxy 50% base epoxy cresol novolac type epoxy resin with diethylene glycol dimethyl ether (DMDG) dissolved to 60% by weight, is placed into a container. The contents of the container are agitated and mixed along with a 15 by weight portion of an 80% by weight bis-phenol A type epoxy resin (by Shell Oil, product name: Epicoat 1001) dissolved in methyl-ethyl ketone, a 1.6 weight portion of Imidazole hardening agent (by Shikoku Kasei, product name: 2E4MZ-CN), a 3 weight portion of polyfunctional acrylic monomer consisting of a photosensitive monomer, a 1.5 weight portion of a similar multi-value acrylic monomer (by Kyoei Chemical, product name: DPE6A), and a 0.71 weight portion of a distributed anti-foaming agent (by Sannopco, product name: S-65) into a mixture composition. To this mixture composition is added a 2.0 weight portion of benzophenone as a photopolymerization initiator and a 0.2 weight portion of Michler's ketone (by Kanto Chemical) as a photosensitizer, yielding a solder resist compound (organic resin insulating material) with a viscosity adjusted to 2.0 Pa·s at 25 degrees C. Viscosity measurement was performed using a type B viscometer (by Tokyo Measuring Instruments, model DVL-B) using rotor no. 4 at 60 rpm and rotor no. 3 at 6 rpm.

(13) Next, the solder resist compound described above is applied to the substrate 30 to a thickness of 20 μm and is dried for 20 minutes at 70 degrees C. Thereafter, a photo mask with a thickness of 5 mm, upon which is inscribed a pattern for the resist opening in the solder resist, is attached to the solder resist 70 and exposed to 1000 mJ/cm$^2$ ultraviolet light, then developed using DMTG fluid to form an opening 71 with a diameter of 200 μm (see FIG. 6(C)).

(14) Next, the substrate upon which is formed the solder resist layer (organic resin insulation layer) 70 is immersed for 20 minutes in a non-electrolytic nickel plating fluid with a pH=4.5 that contains nickel chloride ($2.3 \times 10^{-1}$ mol/l), sodium hypophosphite ($2.8 \times 10^{-1}$ mol/l), and sodium citrate ($1.6 \times 10^{-1}$ mol/l), forming a nickel plating film 72 with a thickness of 5 μm on the opening 71. In addition, this substrate is then immersed for 5 minutes in a non-electrolytic plating fluid containing gold potassium cyanide ($7.6 \times 10^{-3}$ mol/l), ammonium chloride ($1.9 \times 10^{-1}$ mol/l), sodium citrate ($1.2 \times 10^{-1}$ mol/l), and sodium hypophosphite ($1.7 \times 10^{-1}$ mol/l) for 7.5 minutes at 80 degrees C., forming a gold plating layer 74 with a thickness of 0.03 μm on the nickel plating layer 72, and thereby forming a solder pad 75 on the conductor circuit 158 (see FIG. 6(D)).

(15) Thereafter, solder paste is applied to the opening 71 in the solder resist layer 70 and reflowed at 200 degrees C. to form a solder bump 76. As a result, the IC chip 20 is installed, yielding the multilayer printed wiring board 10 having the solder bump 76 (see FIG. 7).

In the embodiment as described above, a thermally hardened cycloolefin type resin sheet was used with the inter-layer resin insulating layers 50 and 150. However, it is possible instead to use an epoxy resin film with the inter-layer resin insulating layer 50. This epoxy resin film contains insoluble resins, soluble particles, hardening agents and other compounds.

In the resin film that includes the inter-layer resin insulating layers used according to an embodiment of this invention, the soluble particles described above should preferably be essentially uniformly distributed within the insoluble resin. This makes it possible to form a roughened surface having protrusions and concavities with a uniform level of roughness. Thus, it is possible to assure bonding strength for the metallic layers of the conductor circuit formed thereupon, even when via holes and through holes are formed in the resin film. Resin film containing soluble particles only on the outer surface that forms the roughened surface may also be used. Accordingly, since the areas other than the outer surface of the resin film are not exposed to acids or oxidizing agents, it is possible to predictably guarantee insulating quality between conductor circuits using the inter-layer resin insulating layers.

Figure 10:
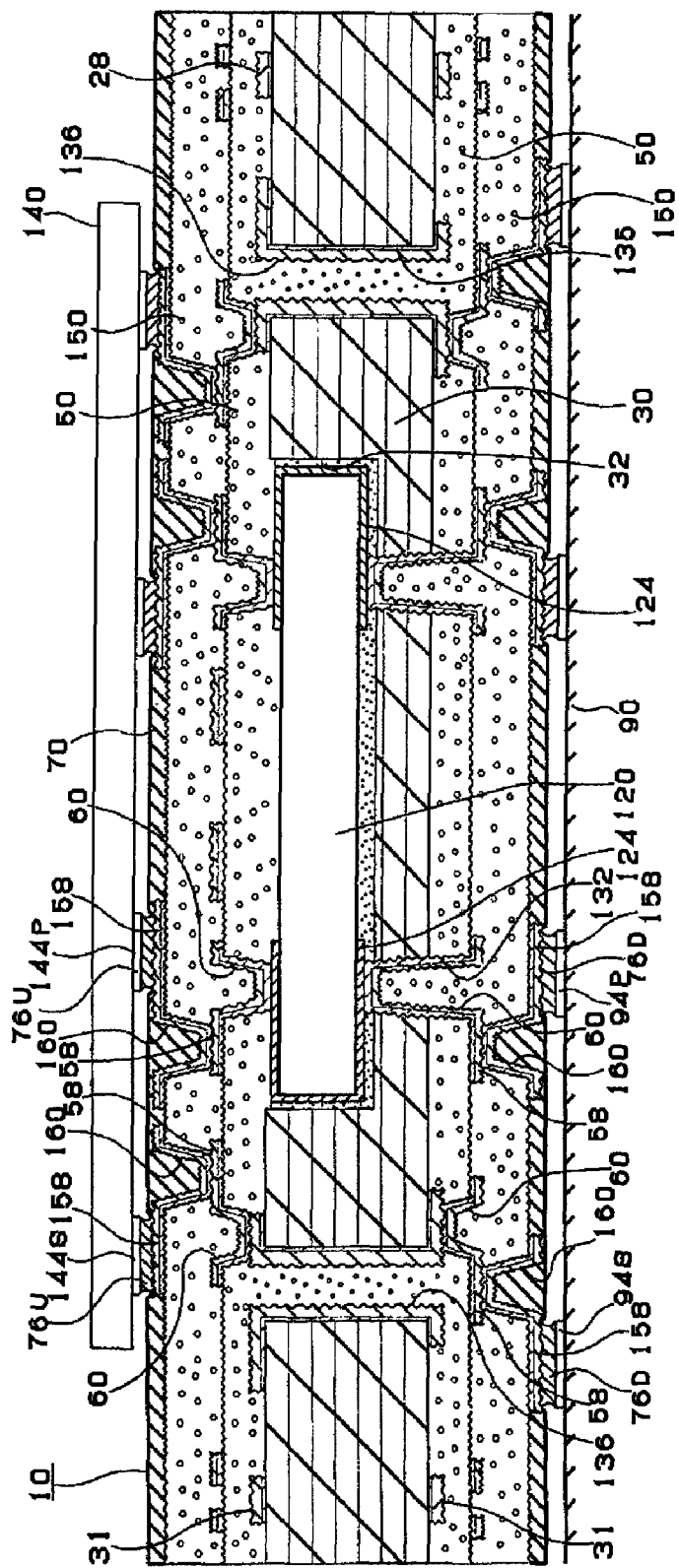
FIG. 10 is a sectional view of the second embodiment of the multilayer printed wiring board of the invention.

Next, a second embodiment of a multilayer printed wiring board according to the invention will be described in reference to FIG. 10.

In the first embodiment as described above, the IC chip was housed within the multilayer printed wiring board. In contrast, in the second embodiment, the multilayer printed wiring board 10 houses a chip capacitor 120, and with an IC chip 140 mounted on an outer surface of the multilayer printed wiring board. The multilayer printed wiring board is mounted on a daughter board 90.

A power source pad 144P on the IC chip 140 is connected to a terminal 124 of a chip capacitor 120 by way of a via hole 60 on the upper surface of the core substrate 30, the conductor circuit 58, the via hole 160, the conductor circuit 158, and the solder bump 76U. The terminal 124 on the chip capacitor 120 is connected with a power source pad 94P on the daughter board 90 by the via hole 60 on the lower surface of the core substrate 30, the conductor circuit 58, the via hole 150, the conductor circuit 158 and the solder bump 76D.

Similarly, a signal pad 144S on the IC chip 140 is connected with a signal pad 94S on the daughter board 90 by way of the solder bump 76U, the conductor circuit 158, the via hole 160, the conductor circuit 58, the via hole 60, a through hole 136 on the core substrate 30, the via hole 60, the conductor circuit 58, the via hole 160, the conductor circuit 158 and the solder bump 76D.

In this second embodiment, a through bore 135 comprising the through-hole 136 on the core substrate 30 is formed in reference to the alignment marks 31 on the core substrate.

In the second embodiment with the chip capacitor 120 disposed below the IC chip 140, the wiring length between the IC chip and the chip capacitor can be shortened. Similarly, with the wiring connected on the lower surface of the chip capacitor 120, the wiring length between the chip capacitor 120 and the daughter board 90 can be shortened. As a result, it is possible to reduce voltage drops in the wiring and to prevent malfunctions in the IC chip 140 due to voltage drops.

Figure 8:
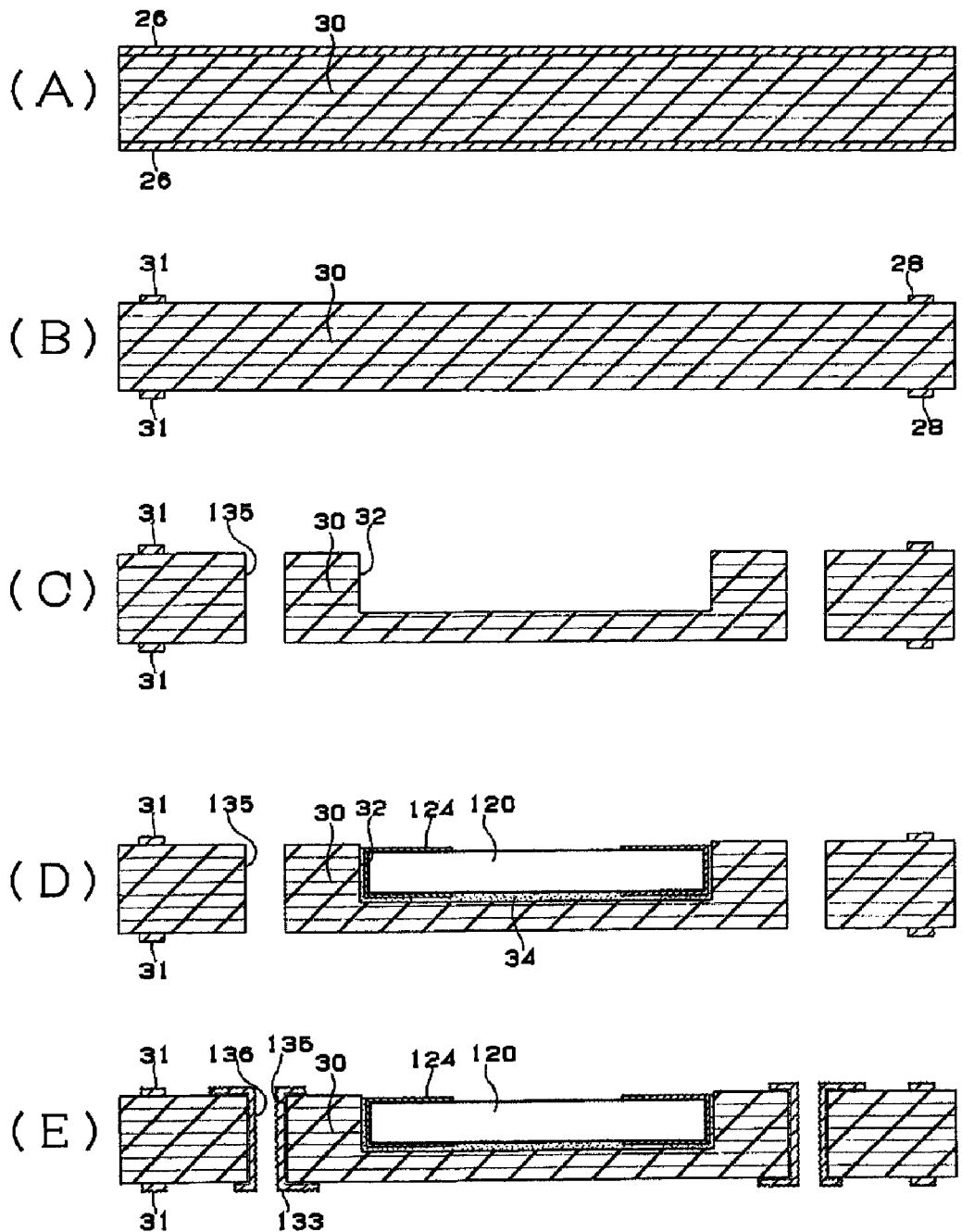
FIGS. 8(A), (B), (C), (D), and (E) are diagrams of manufacturing processes that can be used for manufacturing a second embodiment of the multilayer printed wiring board of the invention.
Figure 9:
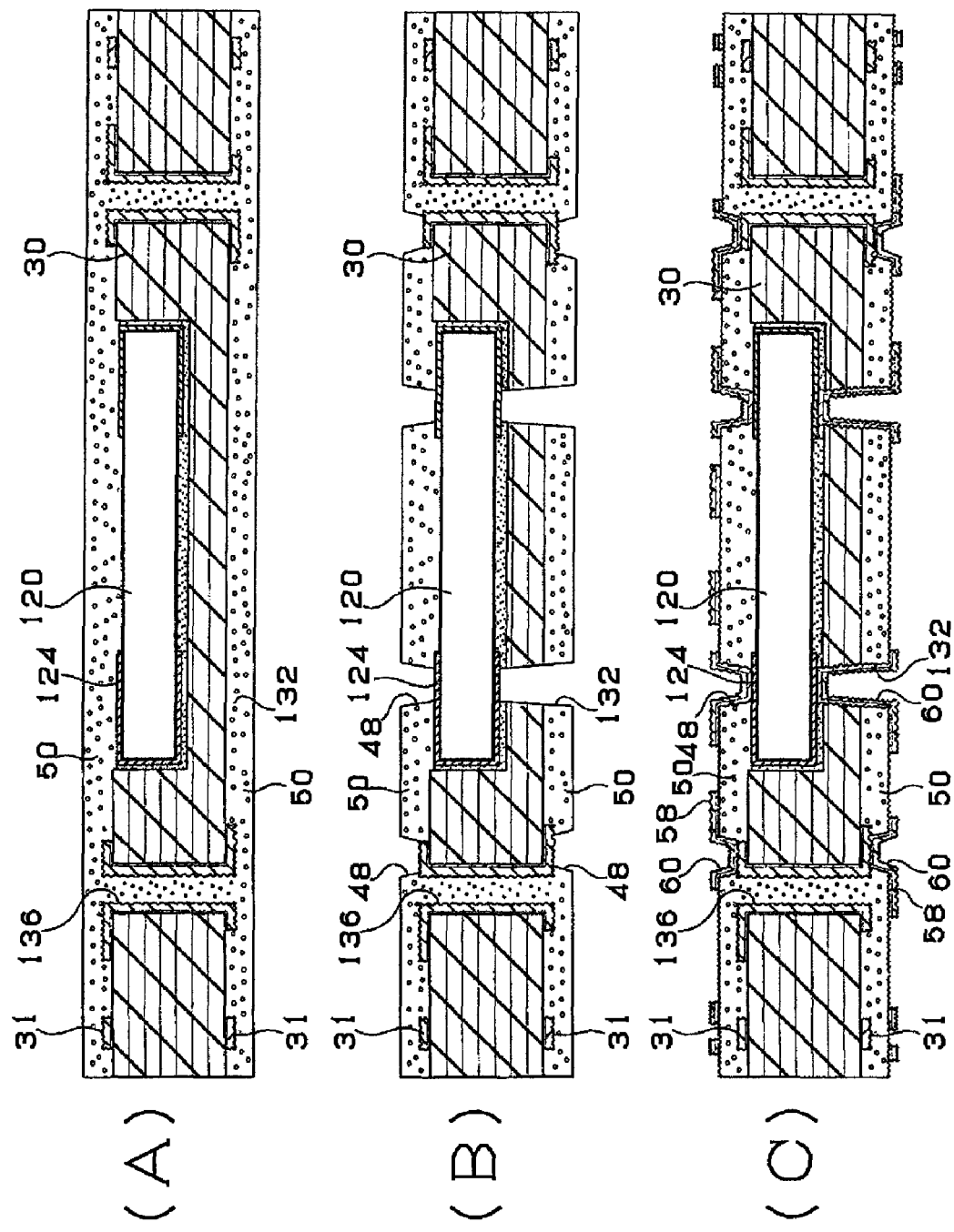
FIGS. 9(A), (B) and (C) are diagrams of the manufacturing processes for the second embodiment of the multilayer printed wiring board of the invention.

Next, a method for manufacturing the multilayer printed wiring board of the second embodiment will be described in reference to FIG. 8 and FIG. 9.

(1) First, an insulating resin substrate (core substrate) consisting of a two-sided copper-clad multilayer sheet covered with prepreg (for which the glass cloth or other core material is impregnated with epoxy or other resin) and layered on both sides with a copper foil 26 is used as the starting material (see FIG. 8(A)). An etching resist with a specified pattern is formed on the copper foil 26 on both sides. The copper foil is removed from the area where the etching resist was not formed, and then the etching resist is peeled off, thus forming the alignment marks 31 and the conductor circuit 28 (see FIG. 8(B)). Next, on one side of the core substrate 30 are formed a concavity 32 for housing the IC chip by concavity fabrication and a through bore 135 serving as through hole by drill fabrication (see FIG. 8(C)).

(2) Thereafter, a printing device is used to apply an adhesive material 34 to the concavity 32. The chip capacitor 120 is aligned in reference to the alignment marks 31 on the core substrate 30, and is mounted on top of the adhesive material 34 (see FIG. 8(D)). In addition, a plating film 133 is disposed on the through bore 135 to form the through-hole 136 (see FIG. 8(E)).

(3) After the above process is complete, a thermally hardened cycloolefin resin sheet with a thickness of 50 μm is heated to a temperature of 50~150 degrees C. and vacuum compression bonding laminated at a pressure of 5 kg/cm$^2$, forming the inter-layer resin insulating layer 50, which is composed of cycloolefin resin (see FIG. 9(A)).

(4) Next, alignment is performed by photographing the alignment mark 31, using a camera (such as camera 80 previously shown), through the inter-layer resin insulating layer 50. A $CO_2$ gas laser is used to dispose an 80 μm via hole opening 48 onto the upper surface of the inter-layer resin insulating layer 50 above the through hole 136, via hole opening 48 onto the upper surface of the inter-layer resin insulating layer 50 above the terminal 124, and a via hole opening 132 on the core substrate 30 (see FIG. 9(B)).

From this point on, in a similar manner as the first embodiment, the conductor circuit 58 is formed on the inter-layer resin insulating layer 50, and the via hole 60 is formed in the via hole opening 48 and the via hole opening 132 (see FIG. 9(C)). As in the first embodiment, furthermore, the higher level inter-layer resin insulating layer 150, the conductor circuit 158, the via hole 160, the solder resist 70, and pads 76U and 76D are formed (see FIG. 10).

Using the method of manufacturing the second embodiment of the invention, it is possible to securely connect the IC chip, the chip capacitor and the inter-layer resin insulating layer via hole even with substrates where the electronic components of the IC chip and chip capacitor are installed. Thus, the electrical connectivity is improved.

Next, a multilayer printed wiring board according to another embodiment will be described in reference to FIG. 14.

Figure 14:
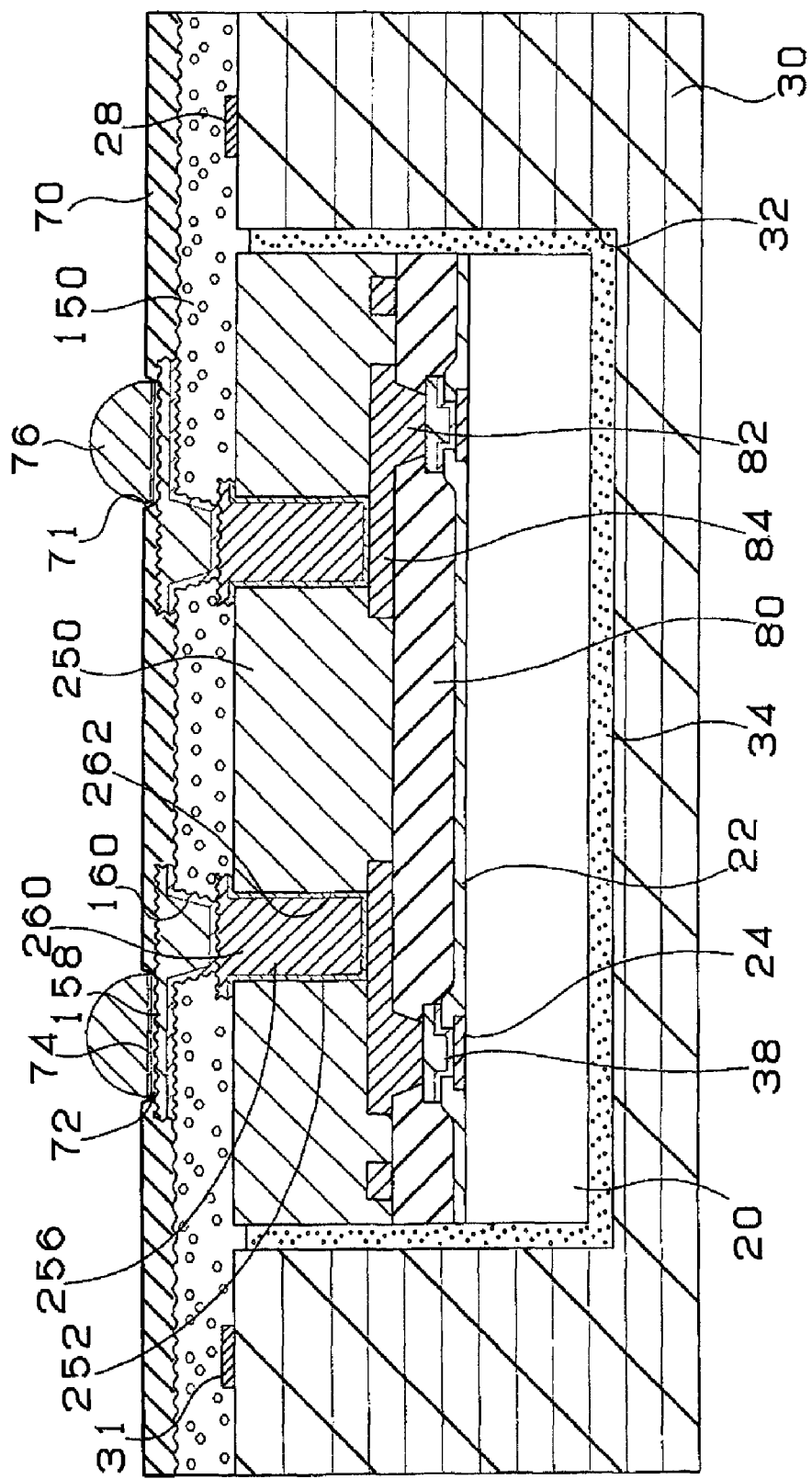
FIG. 14 is a sectional view of the third embodiment of the multilayer printed wiring board of the invention.

In the embodiment of FIG. 14, the multilayer printed wiring board includes an IC chip 20 housed in an insulating resin substrate (core substrate). Upon the core substrate is formed a redistribution layer including a resin layer 80, a via hole 82, and a conductor circuit 84. Formed upon the conductor circuit 84 that is part of that redistribution layer are an insulating resin layer 250 and a cylindrical electrode 260. Furthermore, on the upper layer of the cylindrical electrode 260 is disposed a resin insulating layer 150, upon which are formed a via hole 160 and a conductor circuit 158. A solder bump 76 is disposed on an opening 71 of a solder resist 70 on the resin insulating layer 150.

Figure 12:
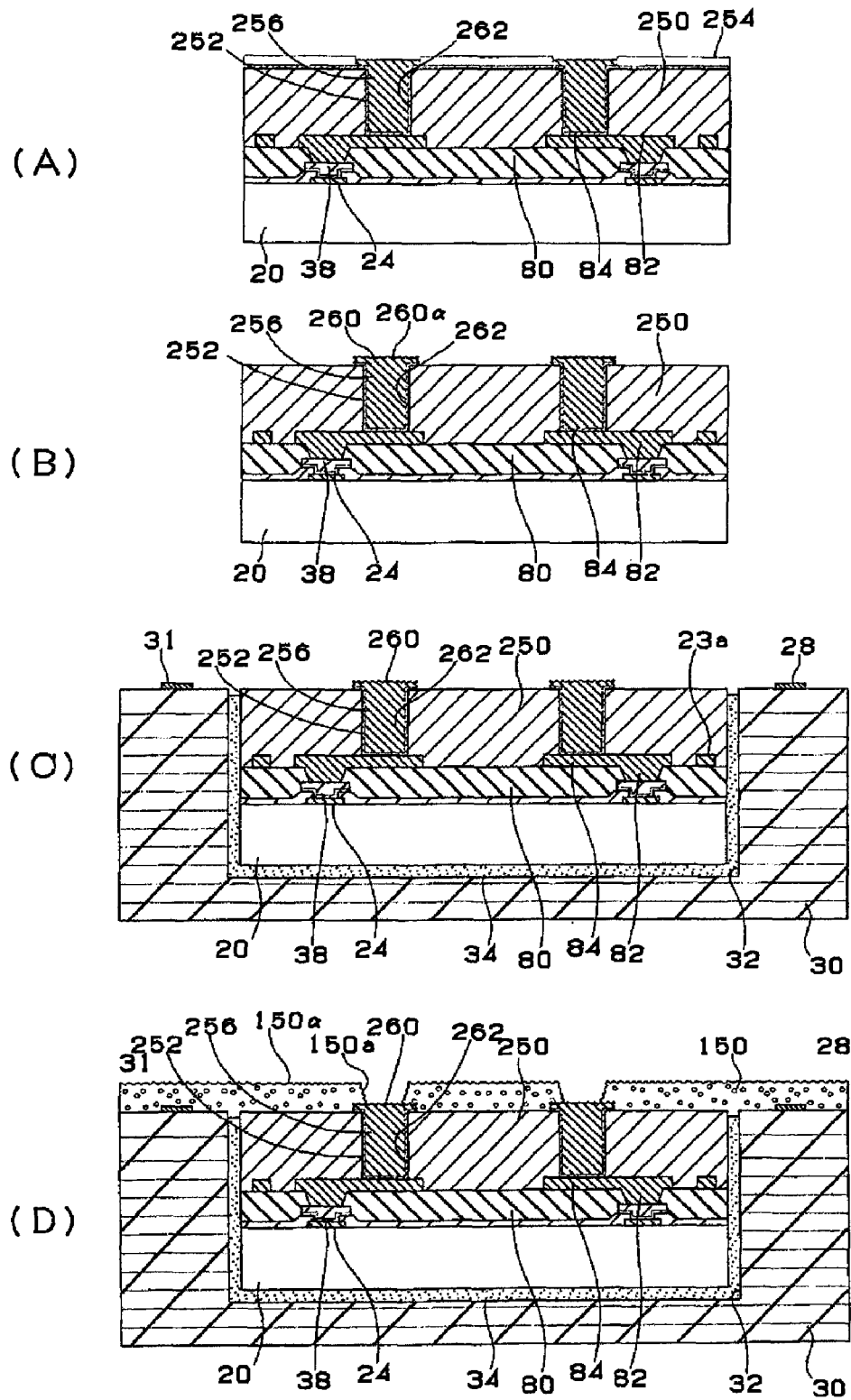
FIGS. 12(A), (B), (C), and (D) are diagrams of manufacturing processes that can be used for the third embodiment of the multilayer printed wiring board of the invention.
Figure 13:
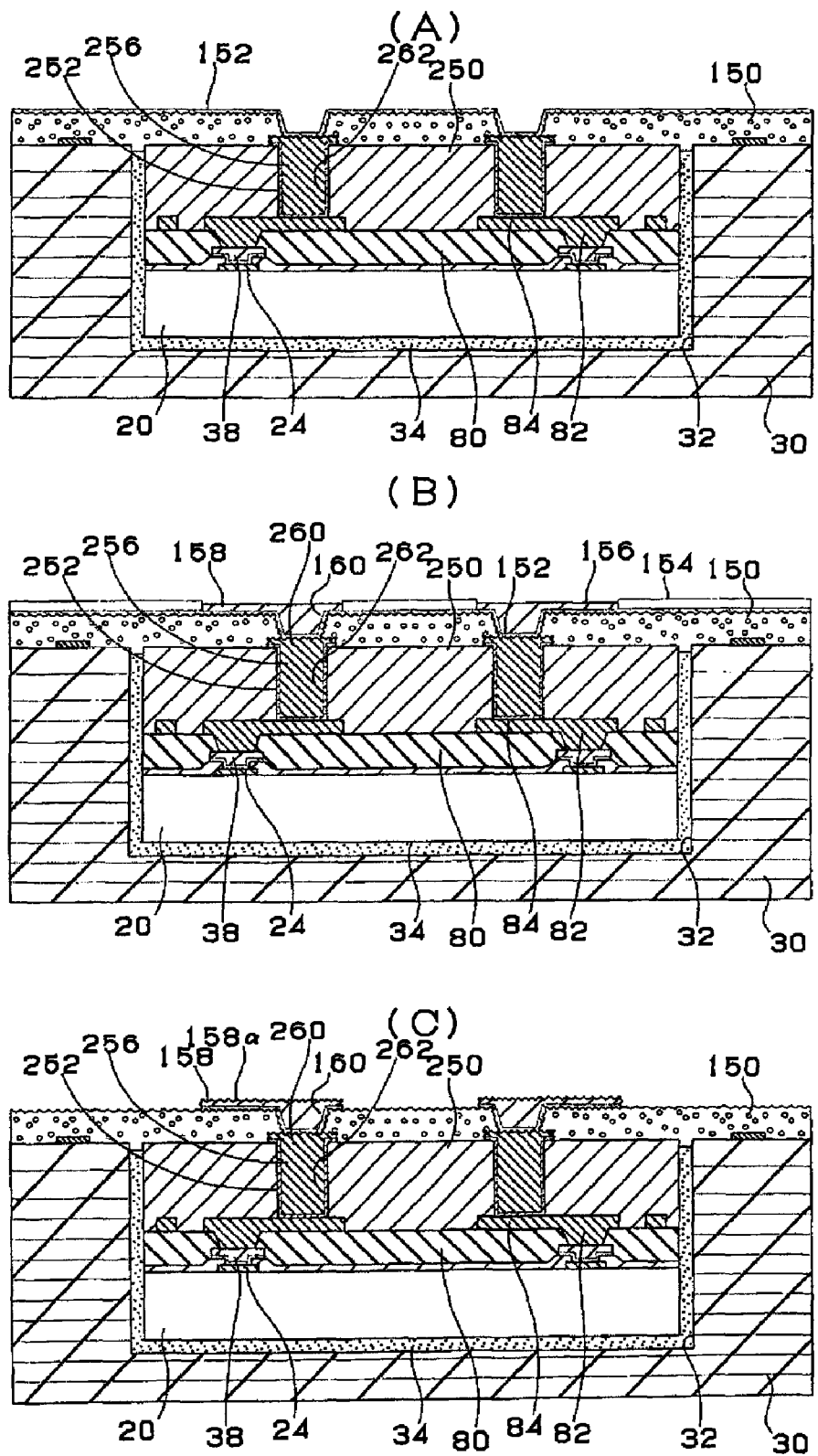
FIGS. 13(A), (B), and (C) are diagrams of manufacturing processes that can be used for the third embodiment of the multilayer printed wiring board of the invention.

A method of manufacturing the multilayer printed wiring board of FIG. 14 is now described in reference to FIG. 11 through FIG. 13.

The IC chip upon which is formed the redistribution layer (which comprises the resin layer 80, the via hole 82, and the conductor circuit 84) is provided as seen in FIG. 11(A). Alignment mark 23a is also formed. The insulating resin layer 250 is formed on the IC chip 20, and a laser is used to form a cylindrical-opening 262 in reference to the alignment marks 31 on the core substrate 30 (FIG. 11(B)). A non-electrolytic copper plating film 252 is formed on the outer surface of the insulating resin layer 250 and within the opening 262 (FIG. 11(C)).

A plating resist 254 is formed, and an electrolytic copper plating 256 is formed on the area where the plating resist 253 is not formed, and within the opening 262 (FIG. 12(A)). The plating resist is peeled away and the non-electrolytic copper plating film 252 underneath the plating resist is removed, forming the cylindrical electrode 260, including the non-electrolytic plating film 252 and an electrolytic copper plating 256 within the opening 262. In addition, a roughened layer 260α is formed in the exposed area from the insulating resin layer 250 on the cylindrical electrode 260 (FIG. 12(B)).

An adhesive material 34 is applied to the concavity 32 on the core substrate 30, and the IC chip 20 is aligned using the alignment mark 23a on the IC chip 20 in reference to the alignment marks 31 on the core substrate 30. The upper surface of the IC chip 20 is pressed so that the chip is housed within the concavity 32 (see FIG. 12(C)). The resin insulating layer 150, which is composed of cycloolefin resin, is disposed on insulating resin layer 250. In addition, a $CO_2$ gas laser is used to dispose the via hole opening 150a in the resin insulating layer 150. Also, the roughened surface 150α is disposed on the resin insulating layer 150 by immersion in an oxidizing agent, etc (FIG. 12(D)).

A non-electrolytic copper plating film 152 is disposed on the inter-layer resin insulating layer 50 (see FIG. 13(A)). After the process above is concluded, a plating resist 54 is disposed on the substrate 30. In addition, an electrolytic plating is applied for form the electrolytic plating film 156 (see FIG. 13(B)). After the plating resist 154 is peeled off, the non-electrolytic copper plating film 152 underneath the plating resist is removed by etching, forming the conductor circuit 158, which includes the non-electrolytic copper plating film 152 and the electrolytic coating film 156, and via hole 160. An etching fluid containing a second copper complex and organic acids is used to form the roughened surface 158α (see FIG. 13(C)).

Next, a solder resist 70 comprising an opening 70 is formed, and a nickel plating layer 72 and a gold plating layer 74 are formed on the conductor circuit inside the opening 71. In addition, solder paste is applied to the opening 71 on the solder resist layer 70 and is reflowed to form a solder bump 76. As a result, it is possible to obtain a multilayer printed wiring board equipped with the IC chip 20 upon which is formed the redistribution layer, along with the solder bump 76 (see FIG. 14).

Figure 15:
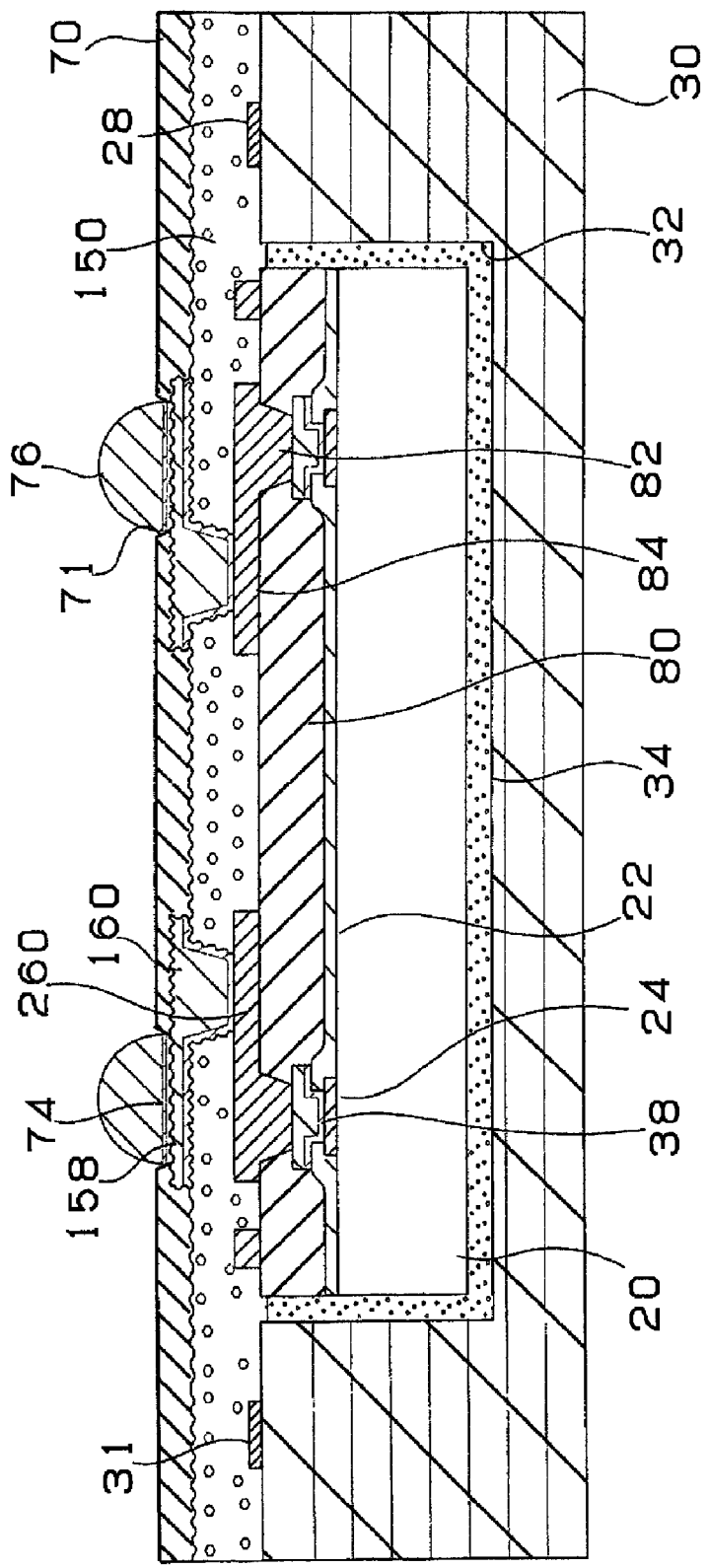
FIG. 15 is a sectional view of a fourth embodiment of the multilayer printed wiring board of the invention.

Next, a multilayer printed wiring board according to yet another embodiment will be described in reference to FIG. 15.

In the embodiment of FIG. 14 described above, a cylindrical electrode was formed on the conductor circuit on the redistribution layer of the IC chip, and a resin insulating layer 150 comprising a via hole 160 and a conductor circuit 158 was disposed on that cylindrical electrode. In the embodiment of FIG. 15, a resin insulating layer 150 including the via hole 160 and the conductor circuit 158 is disposed on the conductor circuit 84 in the redistribution layer of the IC chip 20.

The present application discloses example embodiments of a method for manufacturing a multilayer printed wiring board capable of appropriately forming connections between installed electronic components. In one embodiment alignment marks are formed on a core substrate, and a via hole for connection to a pad on an IC chip 20 is formed on an inter-layer resin insulating layer in reference to the alignment marks with this structure. Accordingly, it is possible to accurately form the via hole on the pad of the IC chip, and it is possible to securely connect the pad and the via hole.

Obviously, numerous modifications and variations of the present invention are possible in light of the above teachings. It is therefore to be understood that within the scope of the appended claims, the invention may be practiced otherwise than as specifically described herein. For example, features of the embodiments described herein may be combined to provide embodiments not explicitly described herein but nevertheless included within the scope of the claims.

The invention claimed is:

1. A method for manufacturing a multilayer printed wiring board having an electronic component housed therein, the method comprising:
   forming a conduction circuit on a core substrate;
   forming an alignment mark on the core substrate separate from the conduction circuit;
   forming a concavity in the core substrate, the concavity being formed in an area of the core substrate not including the conductor circuit and alignment mark;
   inserting the electronic component into the concavity in the core substrate by using the alignment mark on the core substrate to align the electronic component with the concavity, wherein said forming an alignment mark comprises:
      forming a first alignment mark on a first surface of the core substrate; and
      forming a second alignment mark on a second surface of the core substrate,
   said second surface opposing the first surface;
   forming a first interlayer insulating resin on the first surface of the core substrate;
   forming a second interlayer insulating resin on the second surface of the core substrate;
   forming a first via hole opening in the first interlayer insulating resin by using the first alignment mark to align the first via hole opening with a first terminal of the electronic component such that electrical connection can be made to the electronic component by way of the first via hole opening; and
   forming a second via hole opening in the second interlayer insulating resin by using the second alignment mark to align the second via hole opening with a second terminal of the electronic component such that electrical connection can be made to the electronic component by way of the second via hole opening.

2. The method of claim 1, wherein said inserting the electronic component comprises inserting an integrated circuit (IC) chip into the concavity in the core substrate by using the alignment mark on the core substrate to align the IC chip with the concavity.

3. The method of claim 1, wherein said inserting an IC chip into the concavity comprises inserting an IC chip having another alignment mark provided on a surface of the IC chip into the concavity in the core substrate.

4. A method for manufacturing a multilayer printed wiring board having an electronic component housed therein, the method comprising:
   forming a conduction circuit on a core substrate;
   forming an alignment mark on the core substrate separate from the conduction circuit;
   forming a concavity in the core substrate, the concavity being formed in an area of the core substrate not including the conductor circuit and alignment mark; and
   inserting the electronic component into the concavity in the core substrate by using the alignment mark on the core substrate to align the electronic component with the concavity;
   wherein said inserting the electronic component comprises inserting an integrated circuit (IC) chip into the concavity in the core substrate by using the alignment mark on the core substrate to align the IC chip with the concavity;
   wherein said inserting an IC chip into the concavity comprises inserting an IC chip having another alignment mark provided on a surface of the IC chip into the concavity in the core substrate, and
   wherein said inserting the IC chip comprises inserting the IC chip into the concavity in the core substrate by using both the alignment mark on the core substrate and the another alignment mark on the IC chip to align the IC chip with the concavity.

5. The method of claim 4, wherein the forming a conduction circuit and the forming an alignment mark are performed simultaneously in a same process step of the method.

6. The method of claim 4, further comprising:
   forming an interlayer insulating resin on the core substrate and the electronic component; and
   forming a via hole opening in the interlayer insulating resin by using the alignment mark on the core substrate to align the via hole opening with a terminal of the electronic component such that electrical connection can be made to the electronic component by way of the via hole opening.

7. The method of claim 4, wherein said forming an alignment mark comprises:
   forming a first alignment mark on a first surface of the core substrate; and
   forming a second alignment mark on a second surface of the core substrate, said second surface opposing the first surface.

8. The method of claim 4, wherein said inserting an IC chip into the concavity comprises inserting an IC chip having an intermediate conductor layer provided on a pad of the IC chip into the concavity in the core substrate.

9. The method of claim 8, further comprising:
   forming an interlayer insulating resin on the core substrate and the IC chip; and
   forming a via hole opening in the interlayer insulating resin by using the alignment mark on the core substrate to align the via hole opening with the intermediate conductor layer of the IC chip such that electrical connection can be made to the IC chip by way of the via hole opening.

10. The method of claim 8, wherein said inserting an IC chip into the concavity comprises inserting an IC chip, having the intermediate conductor layer larger than the pad, into the concavity in the core substrate.

11. The method of claim 9, further comprising:
    aligning a mask over the interlayer insulating resin by using the alignment mark on the core substrate.

12. The method of claim 4, wherein said inserting an IC chip into the concavity comprises inserting an IC chip having a redistribution layer provided thereon into the concavity in the core substrate.

13. The method of claim 1, wherein said inserting the electronic component comprises inserting a chip capacitor into the concavity in the core substrate by using the alignment mark on the core substrate to align the chip capacitor with the concavity.

14. The method of claim 13, further comprising forming a through hole in the core substrate by using the alignment mark on the core substrate to align the through hole.

15. A method for manufacturing a multilayer printed wiring board having an electronic component housed therein, the method comprising:

forming a conduction circuit on a core substrate;

forming an alignment mark on the core substrate separate from the conduction circuit;

forming a concavity in the core substrate, the concavity being formed in an area of the core substrate not including the conductor circuit and alignment mark; and inserting the electronic component into the concavity in the core substrate by using the alignment mark on the core substrate to align the electronic component with the concavity;

wherein said inserting the electronic component comprises inserting a chip capacitor into the concavity in the core substrate by using the alignment mark on the core substrate to align the chip capacitor with the concavity; and wherein:

said forming an alignment mark comprises:

forming a first alignment mark on a first surface of the core substrate; and forming a second alignment mark on a second surface of the core substrate, said second surface opposing the first surface; and said method further comprises:

forming a first interlayer insulating resin on the first surface of the core substrate;

forming a second interlayer insulating resin on the second surface of the core substrate;

forming a first via hole opening in the first interlayer insulating resin by using the first alignment mark to align the first via hole opening with a first terminal of the chip capacitor such that electrical connection can be made to the chip capacitor by way of the first via hole opening; and forming a second via hole opening in the second interlayer insulating resin by using the second alignment mark to align the second via hole opening with a second terminal of the chip capacitor such that electrical connection can be made to the chip capacitor by way of the second via hole opening.

16. The method of claim 15, further comprising:

forming an integrated circuit (IC) chip over said first interlayer insulating resin on the first surface of the core substrate such that the IC chip is electrically connected to the terminal of the chip capacitor through the first interlayer insulating resin; and forming a daughter board over said second interlayer insulating resin on the second surface of the core substrate such that the IC chip is electrically connected to the terminal of the chip capacitor through the second interlayer insulating resin.

\* \* \* \* \*